(12) United States Patent
Yakushiji et al.

(10) Patent No.: US 10,971,332 B2
(45) Date of Patent: Apr. 6, 2021

(54) PLASMA PROCESSING APPARATUS AND PLASMA PROCESSING METHOD

(71) Applicant: CANON ANELVA CORPORATION, Kawasaki (JP)

(72) Inventors: Hiroshi Yakushiji, Tokyo (JP); Yuto Watanabe, Chofu (JP); Masahiro Shibamoto, Hachioji (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 16/871,863

(22) Filed: May 11, 2020

(65) Prior Publication Data
US 2020/0273672 A1 Aug. 27, 2020

Related U.S. Application Data

(63) Continuation of application No. PCT/JP2017/040725, filed on Nov. 13, 2017.

(51) Int. Cl.
*H01J 37/32* (2006.01)
*H01J 37/147* (2006.01)
*H05H 1/50* (2006.01)

(52) U.S. Cl.
CPC .... *H01J 37/32055* (2013.01); *H01J 37/1471* (2013.01); *H01J 37/1475* (2013.01); *H05H 1/50* (2013.01)

(58) Field of Classification Search
CPC .............. H01J 37/1471; H01J 37/1475; H01J 37/32055; H01J 37/32357; H01J 37/3266; H01J 37/32871
See application file for complete search history.

(56) References Cited

U.S. PATENT DOCUMENTS

9,426,875 B2   8/2016  Sagisaka et al.
2003/0094366 A1*  5/2003  Inaba ............... C23C 14/325
                                          204/298.41
(Continued)

FOREIGN PATENT DOCUMENTS

JP   S63202896 A   8/1988
JP   H0565641 A    3/1993
(Continued)

OTHER PUBLICATIONS

International Search Report (PCT/ISA/210) dated Feb. 6, 2018, by the Japan Patent Office as the International Searching Authority for International Application No. PCT/JP2017/040725.

(Continued)

*Primary Examiner* — Tung X Le
(74) *Attorney, Agent, or Firm* — Buchanan Ingersoll & Rooney PC

(57) ABSTRACT

A plasma processing apparatus includes a processing chamber configured to process a substrate, a plasma generator configured to generate a plasma, a transport unit configured to transport, to the processing chamber, the plasma generated by the plasma generator, and a scanning magnetic field generator configured to generate a magnetic field which deflects the plasma so as to scan the substrate by the plasma. The scanning magnetic field generator is configured to be capable of adjusting a center of a locus of the plasma.

10 Claims, 9 Drawing Sheets

(56) References Cited

U.S. PATENT DOCUMENTS

| | | | |
|---|---|---|---|
| 2003/0201402 A1* | 10/2003 | Ye | H01J 37/147 250/492.21 |
| 2004/0124080 A1* | 7/2004 | Murakami | H01J 37/32623 204/298.41 |
| 2006/0289800 A1* | 12/2006 | Murrell | H01J 37/3171 250/492.21 |
| 2009/0109387 A1* | 4/2009 | Sakai | G02F 1/133734 349/124 |
| 2015/0179404 A1* | 6/2015 | Tamaya | C23C 14/48 204/298.41 |
| 2018/0066353 A1 | 3/2018 | Yakushiji et al. | |

FOREIGN PATENT DOCUMENTS

| | | |
|---|---|---|
| JP | 2003301257 A | 10/2003 |
| JP | 2004060019 A | 2/2004 |
| JP | 5606777 B2 | 10/2014 |
| TW | 201715062 A | 5/2017 |

OTHER PUBLICATIONS

Written Opinion (PCT/ISA/237) dated Feb. 6, 2018, by the Japan Patent Office as the International Searching Authority for International Application No. PCT/JP2017/040725.

* cited by examiner

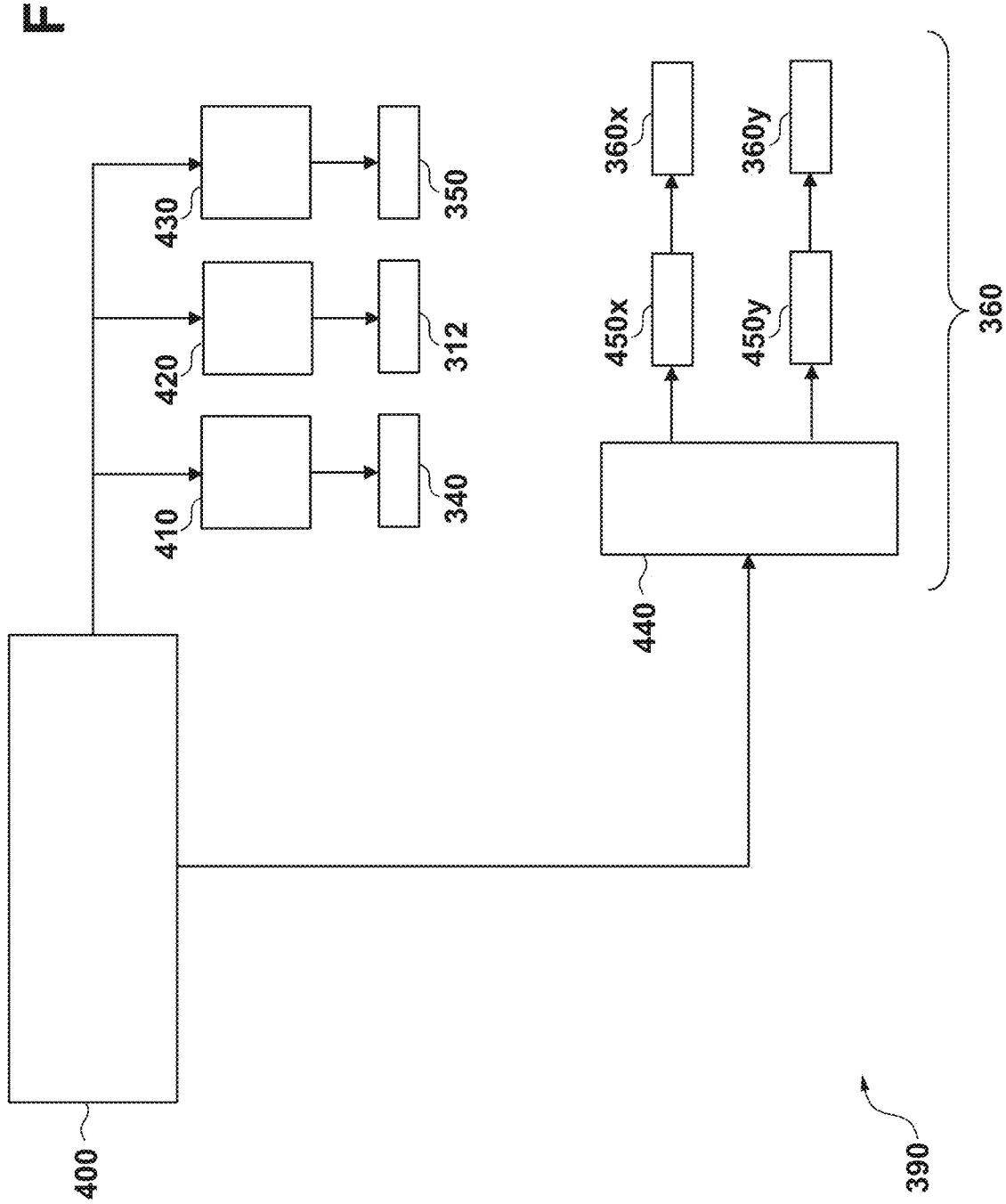

PLASMA PROCESSING APPARATUS AND PLASMA PROCESSING METHOD

CROSS-REFERENCE TO RELATED APPLICATION

This application is a continuation of International Patent Application No. PCT/JP2017/040725 filed on Nov. 13, 2017, the entire disclosure of which is incorporated herein by reference.

TECHNICAL FIELD

The present invention relates to a plasma processing apparatus and a plasma processing method.

BACKGROUND ART

There is available a plasma processing apparatus that transports a plasma generated by a plasma generator to a processing chamber and processes a substrate by the plasma in the processing chamber. This plasma processing apparatus can be applied to, for example, a deposition apparatus for forming a film on a substrate and an ion implantation apparatus for implanting ions in a substrate. As an example of the deposition apparatus, there is enumerated a vacuum arc deposition apparatus for transporting, to a processing chamber, a plasma generated by vacuum arc discharge between a cathode target and an anode in a plasma generator, and forming a film on a substrate in the processing chamber. The vacuum arc deposition apparatus is useful to form a ta-C (tetrahedral amorphous Carbon) film as the surface protective film of a magnetic recording medium of a hard disk drive. In addition, the vacuum arc deposition apparatus is useful to form a hard film containing a metal element such as Ti or Cr on the surface of a machine part, a cutting tool, or the like.

PTL 1 discloses a plasma flow generation method of generating an arc plasma between a cathode and an anode by arc discharge and generating a plasma flow rotated around a plasma traveling direction by a rotary magnetic field. In this plasma flow generation method, the plasma rotation angle region around the plasma traveling direction is divided into two or more regions, and the plasma rotation speeds in the respective rotation angle regions are made different from each other.

CITATION LIST

Patent Literature

PTL 1: Japanese Patent No. 5606777

SUMMARY OF INVENTION

Technical Problem

In the method described in PTL 1, the plasma flow may drift due to a factor such as localization of the strength of the rotary magnetic field for rotating the plasma, and the center of the plasma flow rotation or the locus is shifted from the center of the substrate. In this case, it is difficult to uniformly process the substrate, for example, to form a film having a uniform thickness on the substrate.

The object of the present invention is to provide a technique advantageous in uniformly processing a substrate.

Solution to Problem

One aspect of the present invention relates to a plasma processing apparatus. The plasma processing apparatus comprises a processing chamber configured to process a substrate, a plasma generator configured to generate a plasma, a transport unit configured to transport, to the processing chamber, the plasma generated by the plasma generator, and a scanning magnetic field generator configured to generate a magnetic field for deflecting the plasma so as to scan the substrate by the plasma, wherein the scanning magnetic field generator is configured to be capable of adjusting a center of a locus of the plasma.

Advantageous Effects of Invention

According to the present invention, there is provided a technique advantageous in uniformly processing a substrate.

BRIEF DESCRIPTION OF DRAWINGS

FIG. 5 is a view showing the arrangement of a power supply system of the plasma processing apparatus shown in FIG. 3;

DESCRIPTION OF EMBODIMENTS

The present invention will be described below by way of its exemplary embodiments with reference to the accompanying drawings.

Figure 1:
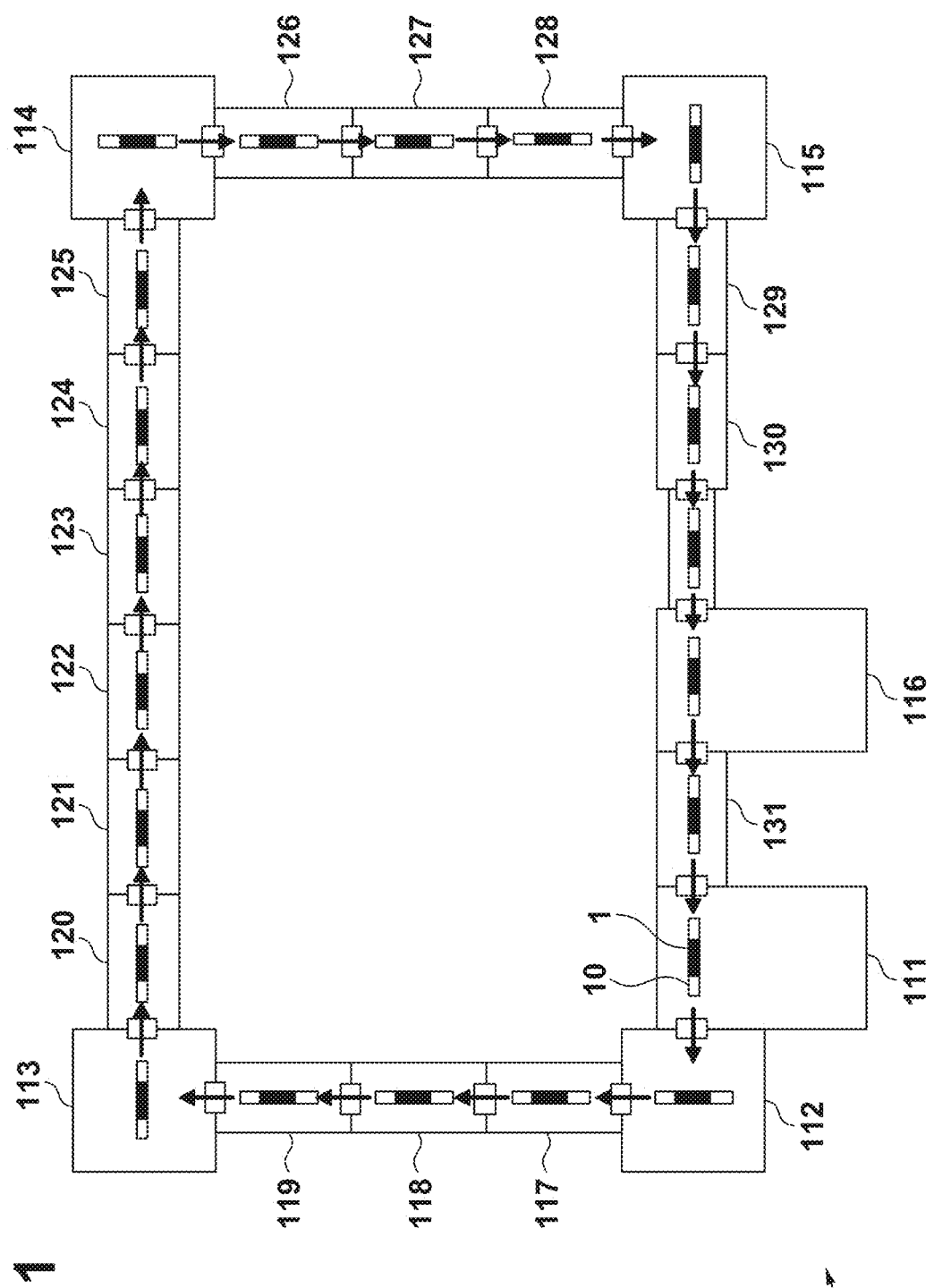
FIG. 1 is a schematic view showing the arrangement of a vacuum processing apparatus according to an embodiment of the present invention.

FIG. 1 schematically shows the arrangement of a vacuum processing apparatus VP according to an embodiment of the present invention. The vacuum processing apparatus VP can be arranged as an in-line deposition apparatus. In the vacuum processing apparatus VP, a plurality of processing chambers 111 to 131 are endlessly connected to form a rectangular shape via gate valves. The processing chambers 111 to 131 are vacuum vessels evacuated by a dedicated or shared exhaust system. A conveying device CNV (see FIG. 3) for conveying a carrier 10 which holds a substrate 1 is incorporated in each of the processing chambers 111 to 131.

The conveying device CNV has a convey path for conveying the carrier 10 in a posture in which the main surface of the substrate 1 held by the carrier 10 is maintained to be vertical to the horizontal surface. The processing chamber 111 is a load lock chamber for performing processing for attaching the substrate 1 to the carrier 10. The processing chamber 116 is an unload lock chamber for performing processing for removing the substrate 1 from the carrier 10. The substrate 1 is suitable for use as, for example, a magnetic recording medium. For example, the substrate 1 can be a metal or glass disc member having an opening (inner peripheral portion) at the central portion. Note that the shape and material of the substrate 1 are not limited to the specific ones.

The processing procedure of a substrate in the vacuum processing apparatus VP will be described below. First, a first substrate 1 is mounted on a first carrier 10 in the processing chamber (load lock chamber) 111. The first carrier 10 is moved to the processing chamber (adhesion layer forming chamber) 117, and an adhesion layer is formed on the first substrate 1. When the first carrier 10 is located in the processing chamber (adhesion layer forming chamber) 117, a second substrate 1 is mounted on a second carrier 10. After that, the second carrier 10 is moved to the processing chamber (adhesion layer forming chamber) 117, and an adhesion layer is formed on the second substrate 1. A third substrate 1 is attached to a third carrier 10 in the processing chamber (load lock chamber) 111. While each carrier 10 is moved in each of the processing chambers 117 to 131, the substrate 1 is processed in each of the processing chambers 117 to 131.

Each of the processing chambers 117 to 131 is a processing chamber for processing each substrate 1. The processing chambers 117 to 128 can be deposition apparatus processing chambers for forming films such as an adhesion layer, a soft magnetic layer, a seed layer, an intermediate layer, and a magnetic layer. The processing chamber 129 can be a plasma processing apparatus processing chamber for forming a surface protective layer made of, for example, a ta-C film. The processing chamber 130 can be, for example, a processing apparatus chamber for processing the surface of the ta-C film formed in the processing chamber 129. Each of the processing chambers 112 to 115 is a processing chamber including a direction change device for changing the convey direction of the substrate 1 through 90°. The processing chamber 131 is an ashing processing chamber for removing a deposit attached to the carrier 10. The vacuum processing apparatus VP can obtain a structure in which, for example, an adhesion layer, a lower soft magnetic layer, a seed layer, an intermediate layer, a magnetic recording layer, and a ta-C film are sequentially formed on the substrate 1.

Figure 2:
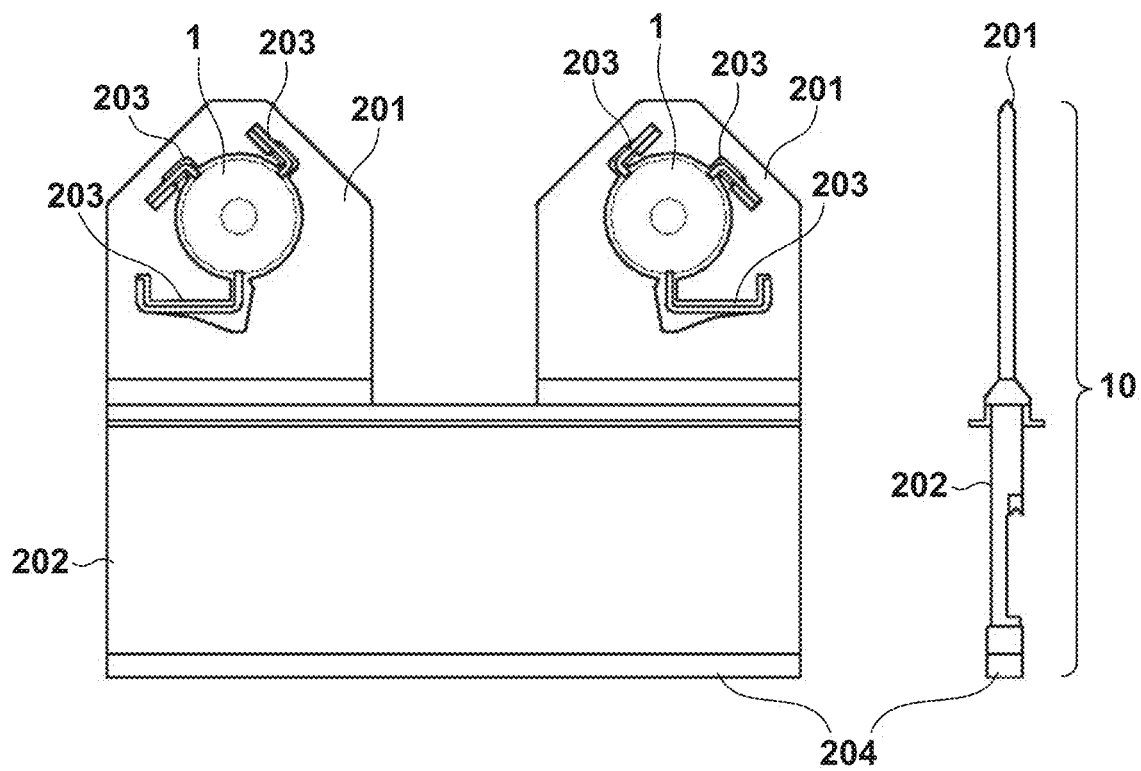
FIG. 2 is a schematic view of a carrier used in the vacuum processing apparatus shown in FIG. 1.

FIG. 2 shows an arrangement example of the carrier 10. The carrier 10 can simultaneously hold, for example, two substrates 1. The carrier 10 can include, for example, two metal holders 201 for holding the substrates 1, respectively, and a slider 202 which supports the two holders 201 and moves along the convey path. A permanent magnet 204 for allowing the conveying device CNV to drive the slider 202 is arranged on the slider 202. Each holder 201 grips the substrate 1 at a plurality of peripheral portions by a plurality of conductive elastic members (leaf springs) 203 without covering the front and rear deposition areas of the substrate 1.

Figure 3:
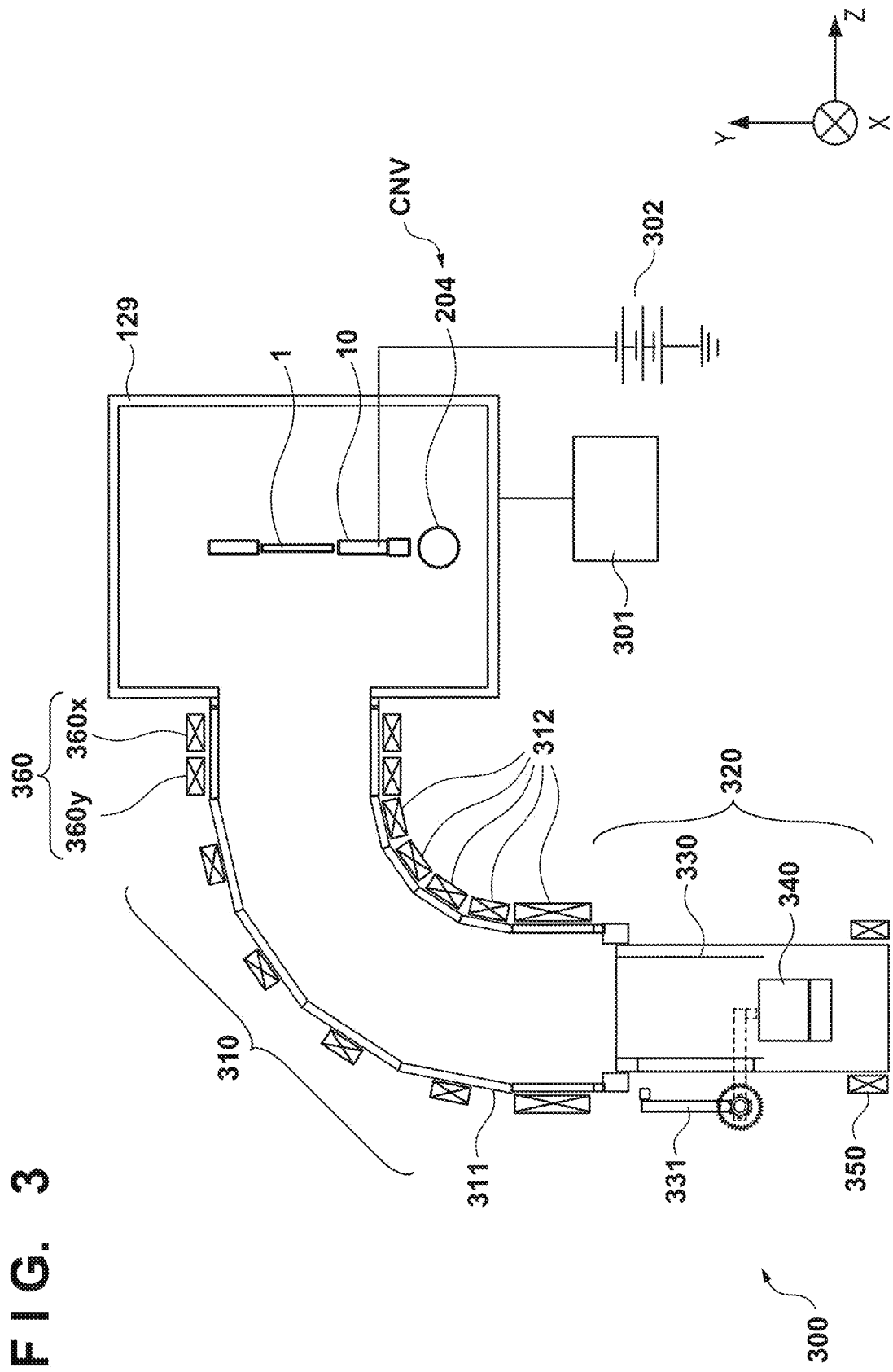
FIG. 3 is a schematic view showing the arrangement of a plasma processing apparatus according to an embodiment of the present invention.

FIG. 3 schematically shows the arrangement of a plasma processing apparatus 300 having the processing chamber 129 and the arrangement of the conveying device CNV. The conveying device CNV includes a large number of driven rollers (not shown) arranged along the convey path and a magnetic screw 303 for driving the carrier 10. When the magnetic screw 303 is rotated and driven, the slider 202 (carrier 10) including the permanent magnet 204 is driven along the convey path. A voltage is applied by a power supply 302 via the conductive elastic members 203 to the substrate 1 held by the holder 201 of the carrier 10. Alternatively, the substrate 1 held by the holder 201 can be grounded via the conductive elastic members 203. A DC voltage, a pulse voltage, or a high-frequency voltage can be applied to the holder 201.

The plasma processing apparatus 300 is arranged to form a ta-C film on the substrate 1 by, for example, vacuum arc deposition. However, this is merely an example. The plasma processing apparatus 300 may generate a plasma by another method. The plasma processing apparatus 300 can include a processing chamber 129 for processing the substrate, a plasma generator 320 for generating a plasma, a transport unit 310 for transporting the plasma generated by the plasma generator 320 to the processing chamber 129, a scanning magnetic field generator 360 for generating the magnetic field for rotating or deflecting the plasma so as to scan the substrate 1 by the plasma, and a vacuum pump 301 such as a turbomolecular pump for evacuating the processing chamber 129. In this example, the processing chamber 129 is arranged as a deposition chamber for forming a ta-C film on the substrate 1.

The transport unit 310 can include a transport duct 311 and a transport magnetic field generator 312 arranged to surround the transport duct 311. The transport duct 311 can be a single bend transport duct bent two-dimensionally as schematically illustrated in FIG. 3. However, the transport duct 311 may be a linear transport duct, a double bend transport duct, or a three-dimensionally curved transport duct. The transport magnetic field generator 312 may include a magnetic field generator arranged inside (vacuum side) the transport duct 311. The transport magnetic field generator 312 may include a transport magnetic field generation coil. The transport magnetic field generator 312 forms, in the transport duct 311, the magnetic field for transporting the plasma (electrons and ions). A plurality of baffle plates can be arranged in the transport duct 311.

The scanning magnetic field generator 360 functions as a deflector for scanning the substrate 1 by the plasma by deflecting the plasma supplied from the transport unit 310 to the processing chamber 129. More specifically, the scanning magnetic field generator 360 generates a magnetic field for rotating or deflecting the plasma so as to scan the substrate 1 by the plasma supplied from the transport unit 310 to the processing chamber 129. This scanning can be performed so as to uniformly supply carbon ions to the film forming region of the substrate 1.

In this example, the plasma generator 320 generates a plasma by vacuum arc discharge, but may generate a plasma by another method. The plasma generator 320 can include a cathode target 340, an anode 330, a movable anode 331, and a stabilizing coil 350. In this example, the cathode target 340 is a graphite target for forming the ta-C film. However, the cathode target 340 may be made of a material (for example, titanium nitride, titanium oxide, chromium nitride, chromium oxide, aluminum nitride, aluminum oxide, zinc nitride, zinc oxide, copper nitride or copper oxide) corresponding to a film to be formed on the substrate 1. The anode 330 forms, for example, a cylindrical shape. However, the shape of the anode 330 is not limited to a specific one if the shape does not block the transport of electrons or carbon ions to the transport unit 310. The anode 330 is made of a graphite material. However, the material of the anode 330 may be any one if it is conductive and is not melted by a plasma generated by arc discharge.

The movable anode 331 is an electrode for inducing arc discharge between the cathode target 340 and the anode 330. The movable anode 331 retracted outside the anode 330 is driven toward the cathode target 340 to bring the movable anode 331 into mechanical contact with the cathode target 340. The movable anode 331 is separated from the cathode target 340 in a state in which the arc current flows from the movable anode 331 to the cathode target 340, thereby generating the arc discharge. The electron current or the ion current is maintained between the anode 330 and the cathode target 340 to make it possible to maintain the arc discharge. By the arc discharge, the carbon ions and electrons are emitted from the cathode target 340 to generate a plasma containing the carbon ions and electrons.

The stabilizing coil 350 is arranged on the opposite side of the discharge surface side (the side of the transport unit 310) of the cathode target 340 to form a magnetic field for stabilizing the arc discharge. The magnetic field generated by the stabilizing coil 350 and the transport magnetic field generated by the transport magnetic field generator 312 are cusp magnetic fields (magnetic fields in opposite directions). The cusp magnetic fields make it possible to control the behavior of the arc spot, assure the low-load current path between the cathode target 340 and the anode 330, and stabilize the arc discharge. A permanent magnet may be arranged in place of the stabilizing coil 350.

The plasma containing carbon ions generated by the arc discharge is transported to the processing chamber 129 along the transport magnetic field in the transport unit 310, and a ta-C film is formed on the substrate 1 arranged in the processing chamber 129. An inert gas such as argon and/or a reactive gas such as nitride gas may be supplied as the process gas to the plasma generator 320.

Figure 4A:
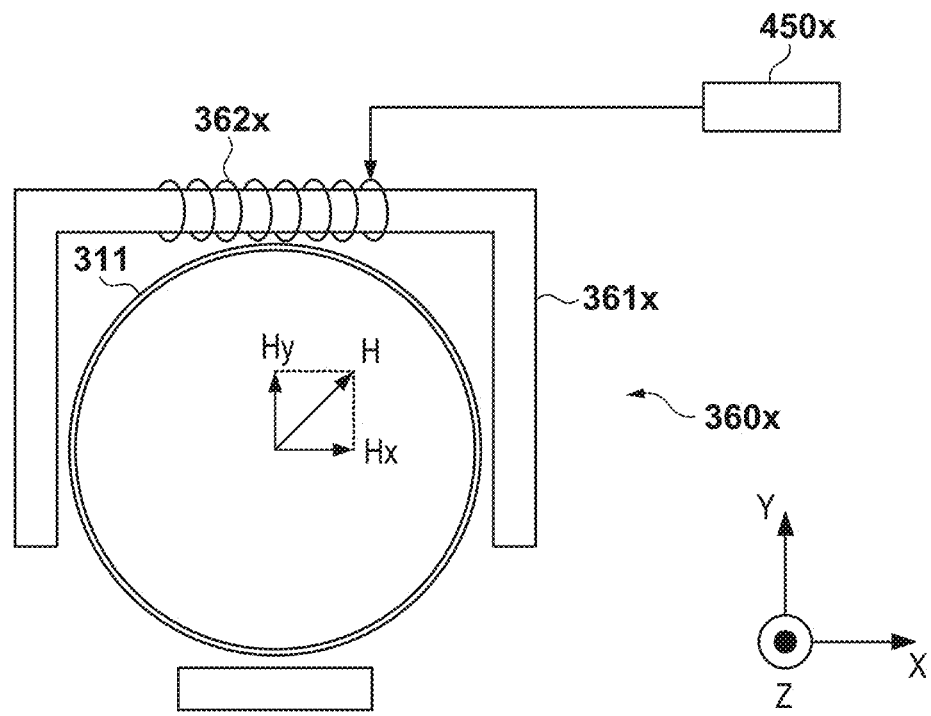
FIG. 4A is a schematic view showing a first magnetic field generator of a scanning magnetic field generator of the plasma processing apparatus shown in FIG. 3.
Figure 4B:
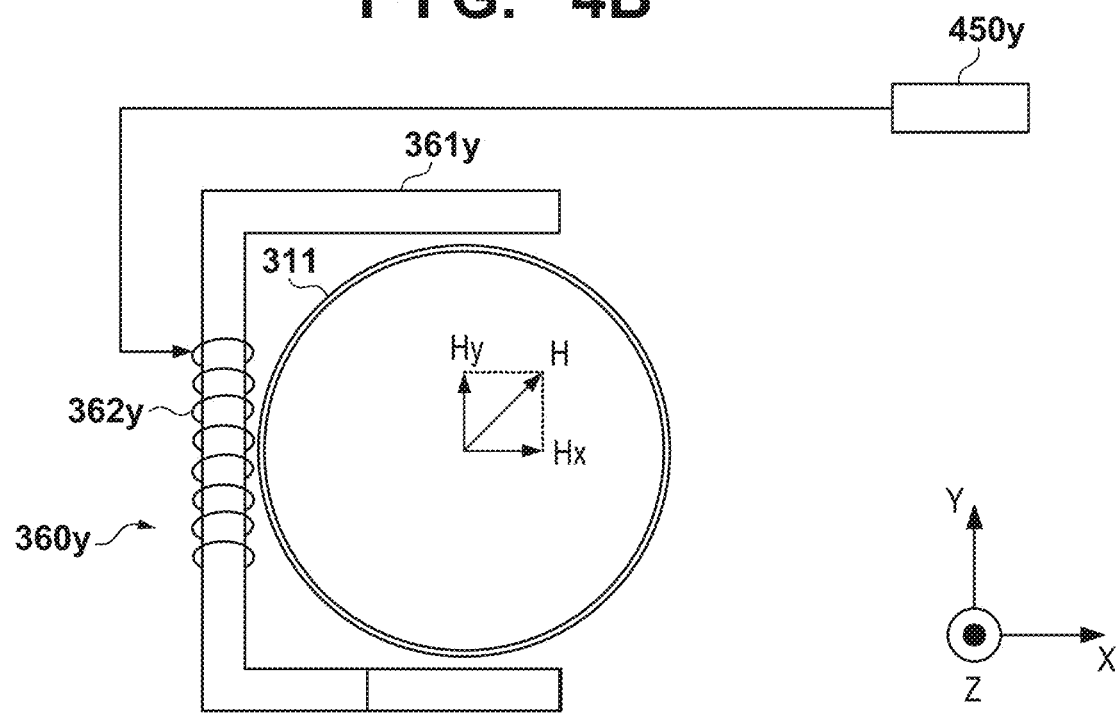
FIG. 4B is a schematic view showing a second magnetic field generator of a scanning magnetic field generator of the plasma processing apparatus shown in FIG. 3.

FIGS. 4A and 4B show the arrangement examples of the scanning magnetic field generator 360. The scanning magnetic field generator 360 includes a first magnetic field generator 360$x$ for generating a first magnetic field Hx parallel to the first direction (in this example, the X-axis direction) and a second magnetic field generator 360$y$ for generating a second magnetic field Hy parallel to the second direction (in this example, the Y-axis direction) crossing the first direction. The first magnetic field generator 360$x$ can include a first yoke 361$x$, and a first coil 362$x$ wound around the first yoke 361$x$. Similarly, the second magnetic field generator 360$y$ can include a second yoke 361$y$ and a second coil 362$y$ wound around the second yoke 361$y$. The first direction and the second direction can be directions perpendicular to each other. A synthesized magnetic field H is formed as a scanning magnetic field by the first magnetic field Hx and the second magnetic field Hy. The scanning magnetic field generator 360 generates the first magnetic field Hx and the second magnetic field Hy so as to rotate the synthesized magnetic field H (so as to rotate the vector indicating the synthesized magnetic field H). The scanning magnetic field generator 360 can include a first power supply 450$x$ for supplying, as a first current, a current obtained by superimposing the first DC component on a first sinusoidal wave to (the first coil 362$x$ of) the first magnetic field generator 360$x$ and a second power supply 450$y$ for supplying, as a second current, a current obtained by superimposing the second DC component on a second sinusoidal wave to (the second coil 362$y$ of) the second magnetic field generator 360$y$. The scanning magnetic field generator 360 is arranged to make it possible to adjust the center of the rotation of the plasma or the locus of the plasma.

FIG. 5 shows a power supply system 390 of the plasma processing apparatus 300. The power supply system 390 can include a control unit 400, an arc power supply 410, a transport power supply 420, a stabilizing coil power supply 430, a function generator 440, the first power supply 450$x$, and the second power supply 450$y$. The arc power supply 410 supplies a current to the cathode target 340. The transport power supply 420 supplies a current to the transport magnetic field generator 312. The stabilizing coil power supply 430 supplies a current to the stabilizing coil 350. The function generator 440 supplies the pre-programmed first signal waveform and the pre-programmed second signal waveform to the first power supply 450$x$ and the second power supply 450$y$, respectively. The first power supply 450$x$ and the second power supply 450$y$ supply the first and second currents having waveforms corresponding to the first and second signal waveforms supplied from the function generator 440 to the first magnetic field generator 360$x$ and the second magnetic field generator 360$y$, respectively. The first power supply 450$x$ and the second power supply 450$y$ can be bipolar power supplies, respectively.

The first power supply 450$x$ supplies, as the first current, a current $Ax\sin(2\pi ft+\alpha x)+Bx$ obtained by superimposing a first DC component $Bx$ on the first sinusoidal wave $Ax\sin(2\pi ft+\alpha x)$ to the first magnetic field generator 360$x$. The second power supply 450$y$ supplies, as the second current, a current $Ay\sin(2\pi ft+\alpha y)+By$ obtained by superimposing a second DC component $By$ on the second sinusoidal wave $Ay\sin(2\pi ft+\alpha y)$ to the second magnetic field generator 360$y$. The first sinusoidal wave $Ax\sin(2\pi ft+\alpha x)$ and the second sinusoidal wave $Ay\sin(2\pi ft+\alpha y)$ can be set by the function generator 440. The first DC component $Bx$ and the second DC component $By$ can be set by the function generator 440. $Ax$ and $Ay$ are amplitudes, f is the frequency, and $\alpha x$ and $\alpha y$ are phases.

A synthesized magnetic field H (scanning magnetic field) of the first magnetic field Hx generated by the first magnetic field generator 360$x$ and the second magnetic field Hy generated by the second magnetic field generator 360$y$ is a magnetic field whose vector is rotated at a predetermined period. The plasma for scanning the substrate 1 is also rotated by the magnetic field H on the substate 1 at a predetermined period. By adjusting the first DC component $Bx$ and the second DC component $By$, the position of the center (center of the vector locus (Lissajous figure) of the synthesized magnetic field H) of the rotation of the vector of the synthesized magnetic field H can be adjusted. That is, by adjusting the first DC component $Bx$ and the second DC component $By$, the center of the rotation or locus of the plasma which scans the substrate 1 can be adjusted.

To set the locus (Lissajous figure) of the vector of the synthesized magnetic field H circular, $Ax=Ay$ and $\alpha y=\alpha x+(1/2+n)\pi$ (n is a natural number) are set. To set the locus (Lissajous figure) of the vector of the synthesized magnetic field H elliptical, $Ax \neq Ay$ and/or $\alpha y \neq \alpha x+(1/2+n)\pi$ are set.

The plasma generated by the arc discharge in the plasma generator 320 is transported up to the substrate 1 in the processing chamber 129 by the transport unit 310. The strength of a magnetic field formed in the transport duct 311 by the transport magnetic field generator 312 has a distribution in which the strength is week near the central portion of the transport duct 311 but is strong toward the duct wall of the transport duct 311. When the plasma is transported in such a magnetic field, the plasma can drift. By using such a drift as one of the factors, the center of the substrate 1 can shift from the center of the rotation or locus of the plasma. The density of the plasma transported from the plasma generator 320 to the substrate 1 by the transport unit 310 has localization. Therefore, the film formed by the plasma scanned by the deflected magnetic field formed by only a sinusoidal wave current can be non-uniform film thickness. On the other hand, as described above, when the plasma is scanned by the magnetic field formed by the first current obtained by superimposing the first DC component on the first sinusoidal wave and the second current obtained by superimposing the second DC component on the second sinusoidal wave, the center of the rotation or locus of the plasma can be adjusted. For example, the center of the rotation or locus of the plasma can match or come close to the center of the substrate. For this reason, the thickness uniformity of the film formed on the substrate can be uniformly adjusted. Alternatively, by arbitrarily adjusting the position of the center of the rotation or locus of the plasma, the thickness uniformity of the film formed on the substrate can be arbitrarily adjusted.

In the above example, the first magnetic field generator 360x and the second magnetic field generator 360y are formed of electromagnets, but the scanning magnetic field generator 360 may be formed of a movable permanent magnet. In this case, by controlling the distance between the first permanent magnet for generating the magnetic field in the first direction and the transport duct 311 and the distance between the second permanent magnet for generating the magnetic field in the second direction and the transport duct 311, the synthesized magnetic field in the transport duct 311 can be controlled.

First Embodiment

Figure 6A:
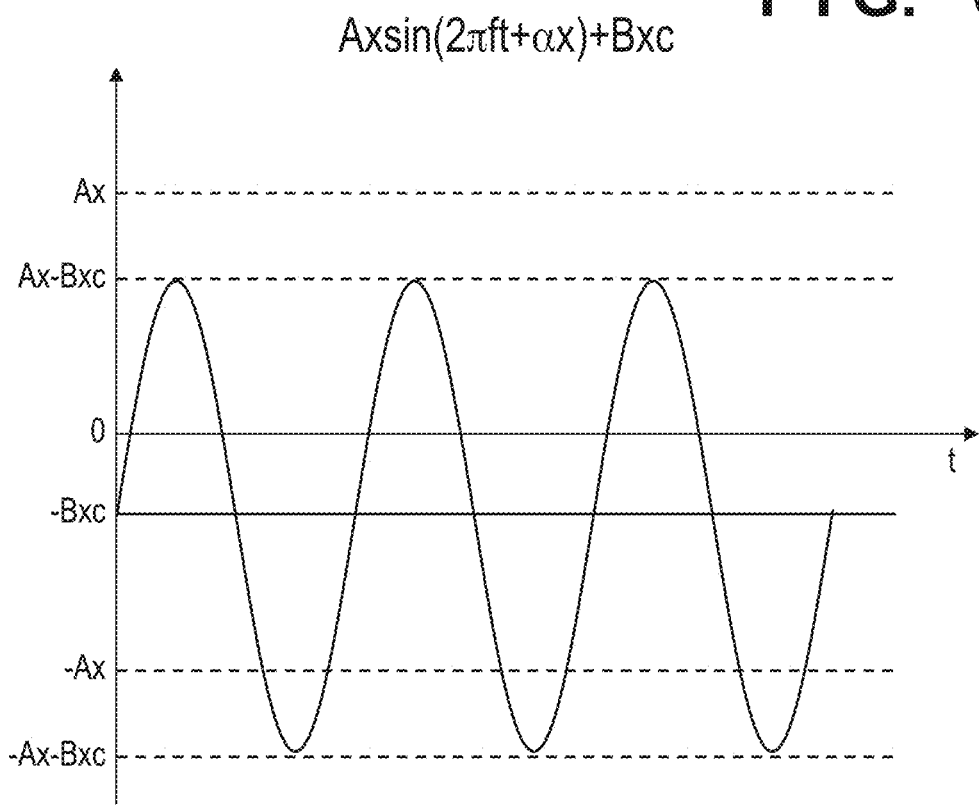
FIG. 6A is a chart exemplifying the waveform of a first current supplied to the first magnetic field generator of the scanning magnetic field generator.
Figure 6B:
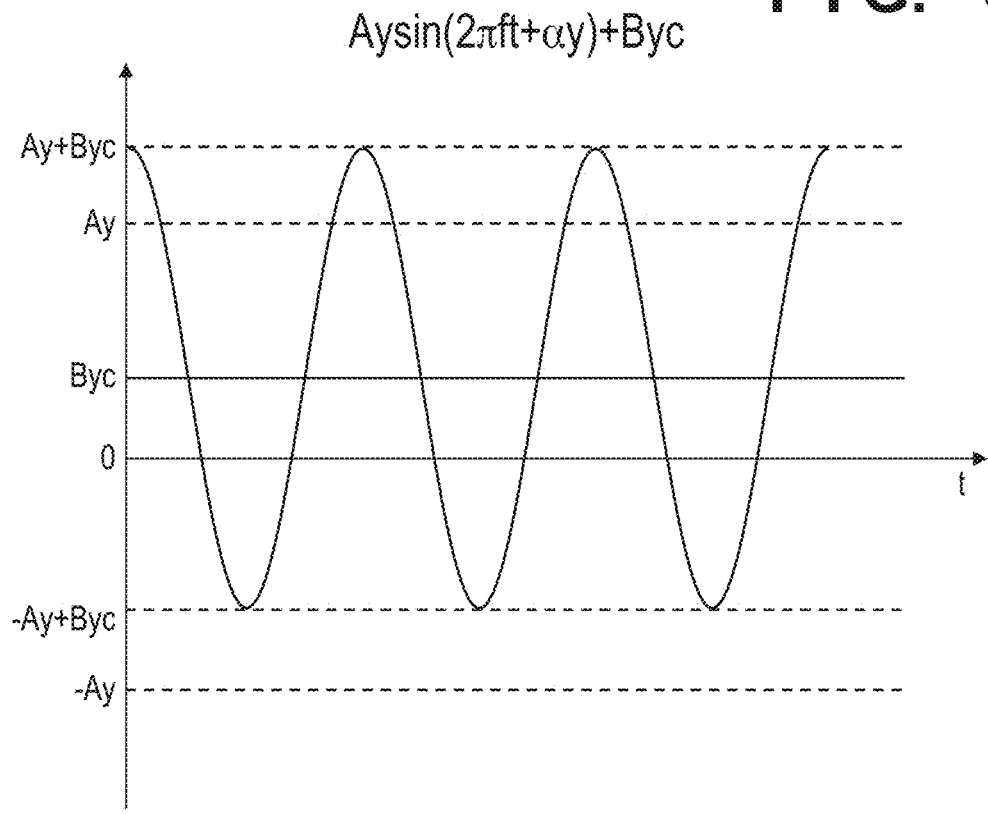
FIG. 6B is a chart exemplifying the waveform of a second current supplied to the second magnetic field generator of the scanning magnetic field generator.

As shown in FIG. 6A, a first power supply 450x supplies, as the first current, a current Axsin($2\pi ft+\alpha x$)+Bxc obtained by superimposing a fixed first DC component Bxc on a first sinusoidal wave Axsin($2\pi ft+\alpha x$) to a first magnetic field generator 360x. As shown in FIG. 6B, a second power supply 450y supplies, as the second current, a current Aysin($2\pi ft+\alpha y$)+Byc obtained by superimposing a second DC component Byc on a second sinusoidal wave Aysin($2\pi ft+\alpha y$) to a second magnetic field generator 360y. Bxc and Byc can be set or adjusted in accordance with the target position of the center of the rotation or locus of the plasma.

Figure 7A:
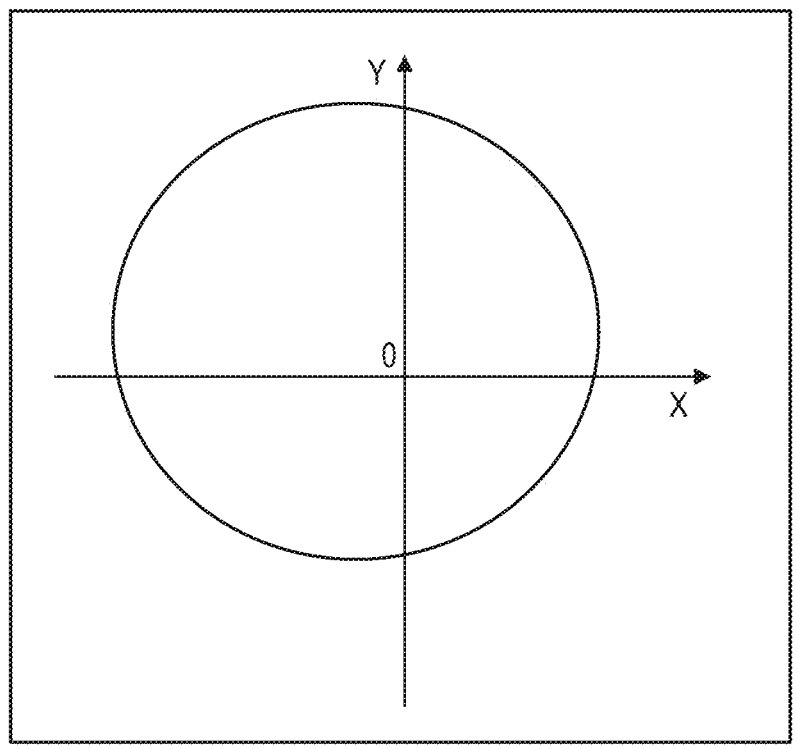
FIG. 7A is a view showing an example of a scanning magnetic field generated by the scanning magnetic field generator.
Figure 7B:
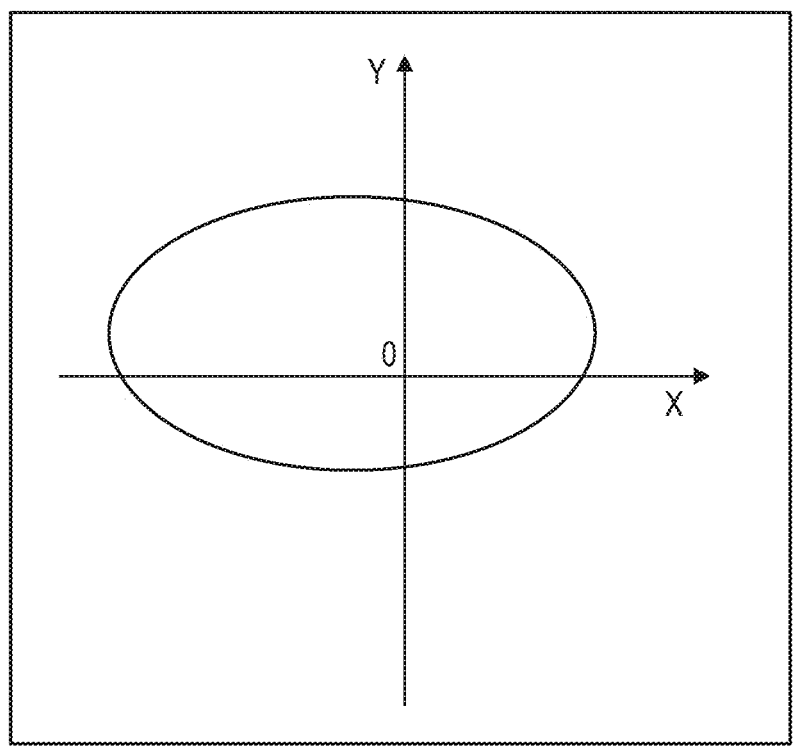
FIG. 7B is a view showing another example of a scanning magnetic field generated by the scanning magnetic field generator.

By setting Ax=Ay and $\alpha y=\alpha x+(1/2+n)\pi$ (n is a natural number), as shown in FIG. 7A, the locus (Lissajous figure) of the vector of the synthesized magnetic field H can be set to be circular. By setting Ax≠Ay and/or $\alpha y \neq \alpha x+(1/2+n)\pi$, as shown in FIG. 7B, the locus (Lissajous figure) of the vector of the synthesized magnetic field H can be set to be elliptical.

Second Embodiment

Figure 8A:
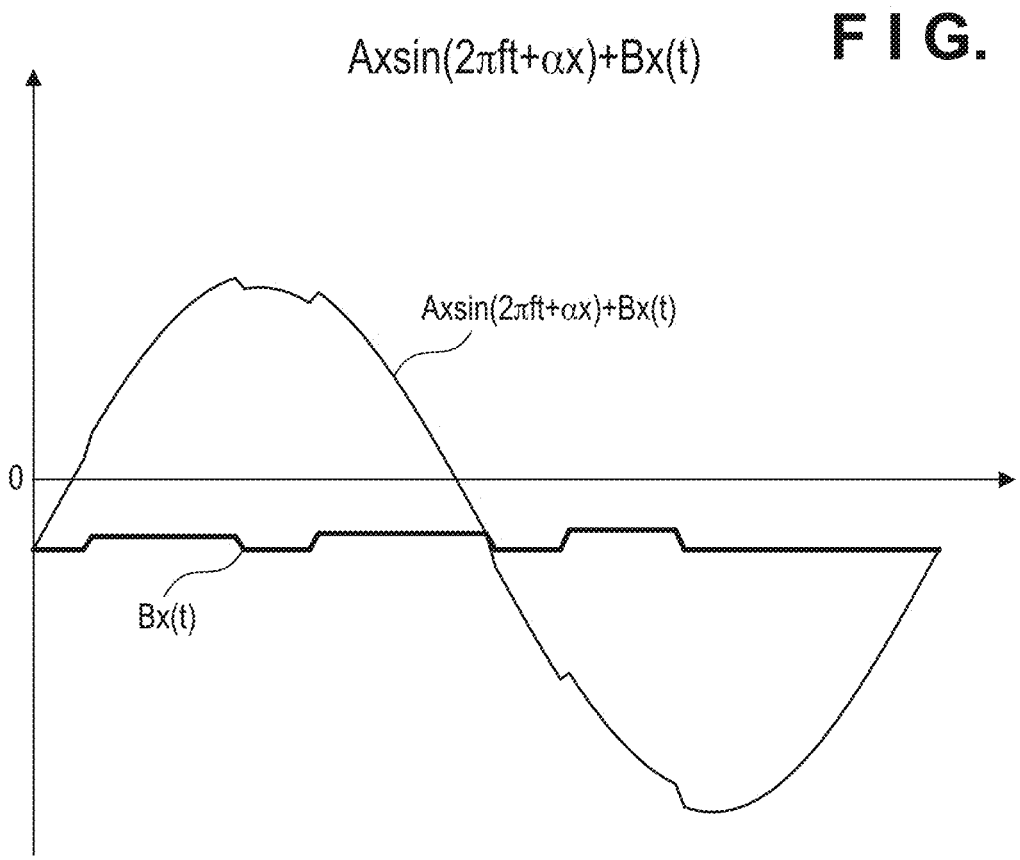
FIG. 8A is a chart exemplifying the waveform of a first current supplied to the first magnetic field generator of the scanning magnetic field generator.
Figure 8B:
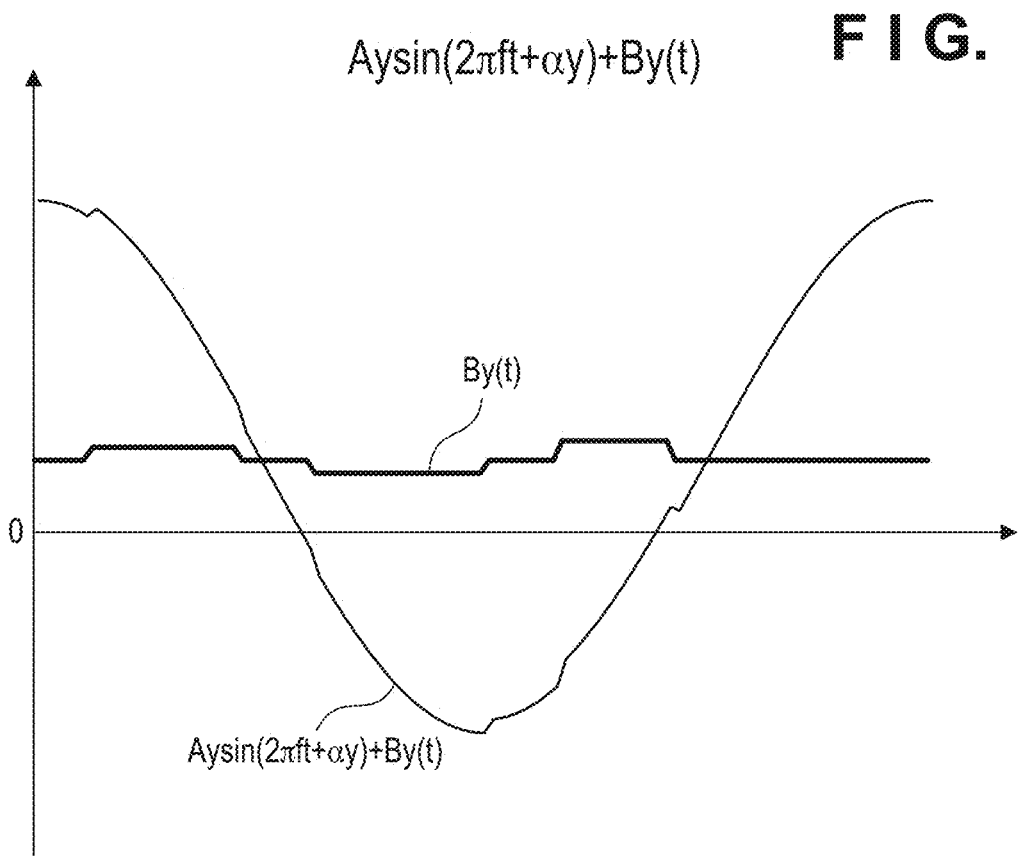
FIG. 8B is a chart exemplifying the waveform of a second current supplied to the second magnetic field generator of the scanning magnetic field generator.
Figure 9:
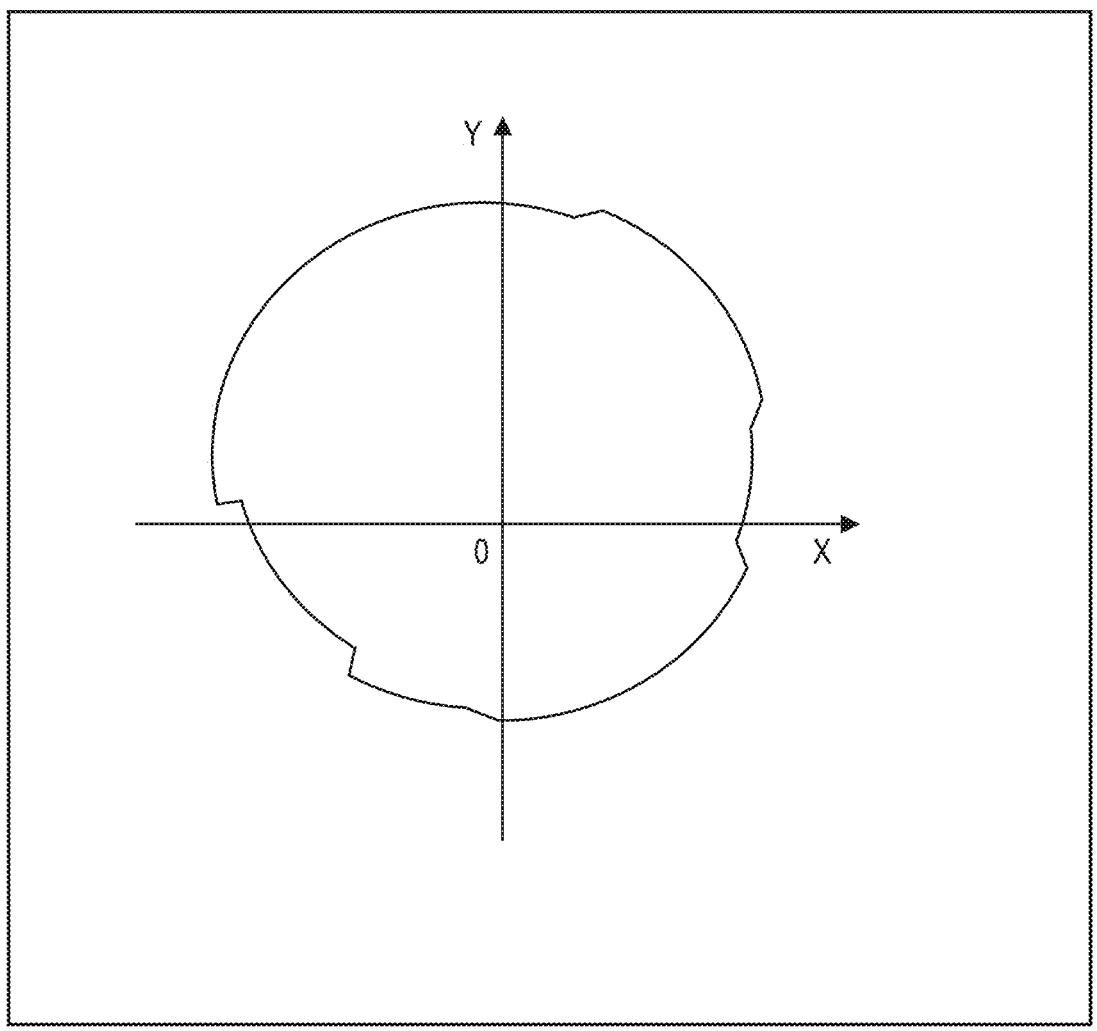
FIG. 9 is a view showing an example of a scanning magnetic field generated by a scanning magnetic field generator.

As shown in FIG. 8A, a first power supply 450x supplies, as the first current, a current Axsin($2\pi ft+\alpha x$)+Bx(t) obtained by superimposing a first DC component Bx(t) on a first sinusoidal wave Axsin($2\pi ft+\alpha x$) to a first magnetic field generator 360x. As shown in FIG. 8B, a second power supply 450y supplies, as the second current, a current Aysin($2\pi ft+\alpha y$)+By(t) obtained by superimposing a second DC component By(t) on a second sinusoidal wave Aysin ($2\pi ft+\alpha y$) to a second magnetic field generator 360y. Bx(t) is the DC component and can be the first periodic signal having the same period as that of the first sinusoidal wave Axsin($2\pi ft+\alpha x$). By(t) is the DC component and can be the second periodic signal having the same period as that of the second sinusoidal wave Aysin($2\pi ft+\alpha y$). Bx(t) and By(t) can be set in accordance with the target position of the center of the rotation or locus of the plasma. One period of the first periodic signal can include at least one first period having the first current value and at least one second period having the second current value different from the first current value. One period of the second periodic signal can include at least one third period having the third current value and at least one fourth period having the fourth current value different from the third current value. FIG. 9 shows an example of the locus (Lissajous figure) of the vector of the synthesized magnetic field H.

As described above, by adjusting the first DC component Bx(t) and the second DC component By(t), the locus of the vector of the synthesized magnetic field H can be controlled to an arbitrary shape. This makes it possible to control the plasma locus to an arbitrary shape (for example, a polygon such as a rectangle). Therefore, for example, the locus of the vector of the synthesized magnetic field H can be decided in accordance with the substrate shape or target film thickness uniformity.

Third Embodiment

A vacuum processing apparatus VP is suitable for the manufacture of a magnetic recording medium. The third embodiment of the present invention relates to a method of manufacturing a magnetic recording medium. This manufacturing method includes steps of forming an adhesion layer, a lower soft-magnetic layer, a seed layer, an intermediate layer, a magnetic recording layer, and a ta-C film on a substrate 1. The step of forming the ta-C film is performed in a plasma processing apparatus 300 having a processing chamber 129.

REFERENCE SIGNS LIST

VP: vacuum processing apparatus, 300: plasma processing apparatus, 129: processing chamber, 1: substrate, 10: carrier, 340: cathode target, 330: anode, 331: movable anode, 312: transport magnetic field generator, 350: stabilizing coil, 360: scanning magnetic field generator, 360x: first magnetic field generator, 360y: second magnetic field generator, 361x: first yoke, 361y: second yoke, 362x: first coil, 362y: second coil, 400: control unit, 410: arc power supply, 420: transport power supply, 440: function generator, 450x: bipolar power supply, 450y: bipolar power supply

The invention claimed is:

1. A plasma processing apparatus comprising:
a processing chamber configured to process a substrate;
a plasma generator configured to generate a plasma;
a transport unit configured to transport, to the processing chamber, the plasma generated by the plasma generator; and
a scanning magnetic field generator configured to generate a magnetic field which deflects the plasma so as to scan the substrate by the plasma, wherein the scanning magnetic field generator is configured to be capable of adjusting a center of a locus of the plasma, wherein the scanning magnetic field generator includes a first magnetic field generator configured to generate a first magnetic field parallel to a first direction, a second magnetic field generator configured to generate a second magnetic field parallel to a second direction crossing the first direction, a first power supply configured to supply a first current to the first magnetic field generator, and a second power supply configured to supply a second current to the second magnetic field generator, and the first power supply supplies, as the first current, a current obtained by superimposing a first DC component on a first sinusoidal wave to the first magnetic field generator, the second power supply supplies, as the second current, a current obtained by superimposing a second DC component on a second sinusoidal wave to the second magnetic field generator, the first DC component and the second DC component being adjustable.

2. The plasma processing apparatus according to claim 1, wherein the first DC component and the second DC component are constant in a period of processing the substrate.

3. The plasma processing apparatus according to claim 1, wherein the first DC component is a first periodic signal having the same period as that of the first sinusoidal wave, and the second DC component is a second periodic signal having the same period as that of the second sinusoidal wave.

4. The plasma processing apparatus according to claim 3, wherein
one period of the first periodic signal includes at least one first period having a first current value and at least one second period having a second current value different from the first current value, and
one period of the second periodic signal includes at least one third period having a third current value and at least one fourth period having a fourth current value different from the third current value.

5. The plasma processing apparatus according to claim 1, wherein
the first power supply and the second power supply include bipolar power supplies, respectively, and
the scanning magnetic field generator further includes a function generator configured to supply a signal waveform to the bipolar power supplies of the first power supply and the second power supply.

6. The plasma processing apparatus according to claim 1, wherein the plasma generator generates the plasma by vacuum arc discharge.

7. A plasma processing method for transporting a plasma generated by a plasma generator to a processing chamber and processing a substrate by the plasma in the processing chamber, comprising:
a step of generating a magnetic field for deflecting the plasma so as to scan the substrate by the plasma transported to the processing chamber,
wherein in the step, a center of a locus of the plasma is adjusted, and
wherein in the step, a first current obtained by superimposing a first DC component on a first sinusoidal wave is supplied to a first magnetic field generator configured to generate a first magnetic field parallel to a first direction, and a second current obtained by superimposing a second DC component on a second sinusoidal wave is supplied to a second magnetic field generator configured to generate a second magnetic field parallel to a second direction crossing the first direction.

8. The plasma processing method according to claim 7, wherein the first DC component and the second DC component are constant in a period of processing the substrate.

9. The plasma processing method according to claim 8, wherein the first DC component is a first periodic signal having the same period as that of the first sinusoidal wave, and the second DC component is a second periodic signal having the same period as that of the second sinusoidal wave.

10. The plasma processing method according to claim 9, wherein
one period of the first periodic signal includes at least one first period having a first current value and at least one second period having a second current value different from the first current value, and
one period of the second periodic signal includes at least one third period having a third current value and at least one fourth period having a fourth current value different from the third current value.

* * * * *